(12) United States Patent
Himeno

(10) Patent No.: US 7,421,609 B2
(45) Date of Patent: Sep. 2, 2008

(54) METHOD, SYSTEM AND APPARATUS FOR PRODUCING A CLOCK WITH DESIRED FREQUENCY CHARACTERISTICS

(75) Inventor: Toshihiko Himeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 480 days.

(21) Appl. No.: 11/181,359

(22) Filed: Jul. 14, 2005

(65) Prior Publication Data

US 2007/0016816 A1  Jan. 18, 2007

(51) Int. Cl.
*G06F 1/04* (2006.01)
(52) U.S. Cl. .................. 713/500; 713/501; 713/502
(58) Field of Classification Search ........... 713/500
See application file for complete search history.

(56) References Cited

U.S. PATENT DOCUMENTS

| | | | | |
|---|---|---|---|---|
| 4,686,386 | A | * | 8/1987 | Tadao .................. 327/143 |
| 5,416,434 | A | * | 5/1995 | Kootstra et al. ........... 327/113 |
| 5,719,800 | A | * | 2/1998 | Mittal et al. ............. 713/321 |
| 5,881,297 | A | * | 3/1999 | McKenzie et al. ......... 713/322 |
| 6,044,282 | A | * | 3/2000 | Hlasny ................. 455/574 |
| 6,073,244 | A | * | 6/2000 | Iwazaki ................. 713/322 |
| 6,176,429 | B1 | * | 1/2001 | Reddersen et al. ..... 235/462.25 |
| 6,202,163 | B1 | * | 3/2001 | Gabzdyl et al. ........... 713/324 |
| 6,222,406 | B1 | * | 4/2001 | Noda et al. ............. 327/269 |
| 6,317,841 | B1 | * | 11/2001 | Nagae et al. ............ 713/322 |
| 6,396,324 | B1 | * | 5/2002 | Hsu et al. .............. 327/298 |
| 6,496,045 | B1 | * | 12/2002 | Nguyen ................. 327/115 |
| 7,293,186 | B2 | * | 11/2007 | Thomas et al. ........... 713/322 |

OTHER PUBLICATIONS

Akui, Satoshi Dynamic Voltage and Frequency Management Low Power Embedded Micro Processor, pp. 64-65, ISSCC Proceedings, 2004.

* cited by examiner

*Primary Examiner*—Nitin C Patel
(74) *Attorney, Agent, or Firm*—Sprinkle IP Law Group

(57) ABSTRACT

Systems and methods for circuits which can reduce the average frequency of a clock signal while keeping the maximum frequency of the clock signal are disclosed. Embodiments of these systems and methods may allow for a circuit which receives a clock signal and can output a clock signal with a frequency which is on average some ratio of the frequency of the received clock signal, but still has a maximum frequency which is substantially equal to the frequency of the received clock signal. In one mode of operation, these circuits may output a clock signal substantially identical to a received clock signal, while in another mode of operation these circuits may output a clock signal substantially identical to a received clock during a time interval, thus reducing the average frequency of the output clock signal with respect to the received clock signal while maintaining the maximum frequency of the received clock signal.

39 Claims, 5 Drawing Sheets

METHOD, SYSTEM AND APPARATUS FOR PRODUCING A CLOCK WITH DESIRED FREQUENCY CHARACTERISTICS

TECHNICAL FIELD OF THE INVENTION

The invention relates in general to circuits, and more particularly, to methods and systems for circuits for providing clock signals.

BACKGROUND OF THE INVENTION

With the advent of the computer age, electronic systems have become a staple of modern life. Part and parcel with this spread of technology comes an ever greater drive for more functionality from these electronic systems. A microcosm of this quest for increased functionality is the size and capacity of various semiconductor devices. From the 8 bit microprocessor of the original Apple I, through the 16 bit processors of the original IBM PC AT, to the current day, the processing power of semiconductors has grown while the size of these semiconductors has consistently been reduce. In fact, Moore's law recites that the number of transistors on a given size piece of silicon will double every 18 months.

As semiconductors have evolved into these complex systems utilized in powerful computing architectures, almost universally, the frequency at which these semiconductors devices operate has been increasing. These modern high-performance systems are designed with a target clock frequency which determines the processing speed of the system.

The continuous quest for higher semiconductor performance has pushed clock frequencies deep into the gigahertz frequency range, reducing the period of the clock signal well below a nanosecond. As the working frequency of advanced semiconductor systems has entered the gigahertz domain, testing these high frequency semiconductors for defects is becoming more difficult.

Defects in a semiconductor may be caused by glitches in the fabrication process, and thus may affect a random distribution of semiconductors. To ensure proper operation of these semiconductors these defects must be detected and the defective semiconductors repaired or disposed of. Consequently, after a semiconductor is fabricated, but at some point before it ships to a customer the semiconductor may undergo a testing process in order to discern which semiconductors have defects.

In main, defects present in a semiconductor consist of two types. Structural faults, relating to the design of the semiconductor and functional faults affecting the operation of the components in the semiconductor. Typically, testing for functional faults validates the correct operation of a system, while testing of structural faults targets manufacturing defects.

Structural faults are in turn usually composed of two main types the stuck-at fault and the transition fault. Stuck-at faults affect the logical behavior of the system, while transition faults affect the timing/temporal behavior of the system. The effect of a transition fault at any point in a circuit is that a transition at that point will not reach a flip-flop, primary output or other circuit element within the target clock period of the circuit.

Typically, to detect these transition faults in a semiconductor an ac test is executed. This ac test may provide a clock to the semiconductor near or above the target clock frequency of the semiconductor under test to test the responses of the gates of the semiconductor at these clock speeds. As the speed of semiconductor devices increases, however, this type of testing becomes increasingly problematic.

In the industry today, automatic test equipment is being used to test these semiconductor devices. Thus, to implement full speed ac testing the test equipment must provide a clock signal near or above the target frequency of the semiconductor. To do this usually means an increase in the cost and complexity of the test equipment, as larger power supplies, regulators and more sensitive measuring equipment is utilized with this testing equipment. Additionally, constantly producing these high frequency clock signals while testing many semiconductors generates temperature regulation and power consumption concerns as well.

Typically, then, high frequency semiconductors are tested at less than their target frequency. This is a non ideal solution, however, as many of these transition faults become problematic only at or near the target frequency of the semiconductor.

Thus, a need exists for circuits which can reduce the average frequency of a clock provided to a semiconductor while still providing at least a portion of the clock signal to the semiconductor at a desired clock frequency.

SUMMARY OF THE INVENTION

Systems and methods for circuits which can reduce the average frequency of a clock signal while keeping the maximum frequency of the clock signal are disclosed. Embodiments of these systems and methods may allow for a circuit which receives a clock signal and can output a clock signal with a frequency which is on average some ratio of the frequency of the received clock signal but still has a maximum frequency which is substantially equal to the frequency of the received clock signal. In one mode of operation, these circuits may output a clock signal substantially identical to a received clock signal, while in another mode of operation these circuits may output a clock signal substantially identical to a received clock substantially only during a time interval. Consequently, the average frequency of the output clock signal is reduced with respect to the received clock signal while maintaining the maximum frequency of the received clock signal.

In one embodiment, a gating circuit operates in two modes. In the first mode the gating circuit produces an output signal substantially identical to an input clock signal. In the second mode of operation, the gating circuit produces an output clock signal substantially identical to an input clock signal during a set of timing intervals.

In another embodiment, the timing intervals may be produced by a counter circuit which determines the duration and frequency of the timing intervals based on the input clock signal.

In still another embodiment, the duration of the timing interval is approximately the same as two clock cycles of the input clock signal.

Embodiments of the present invention provide the technical advantage of producing a clock signal with a maximum frequency of an input clock signal, but with an average frequency less then the input clock signal. Consequently, embodiments of the invention may be utilized in conjunction with the testing of a semiconductor to test the semiconductor at a target clock frequency without having to constantly provide a clock signal of the target frequency to the semiconductor. As a result, testing of a semiconductor at the target frequency may consume less power, produce less heat and in general consume fewer resources and be less costly.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

Figure 1:
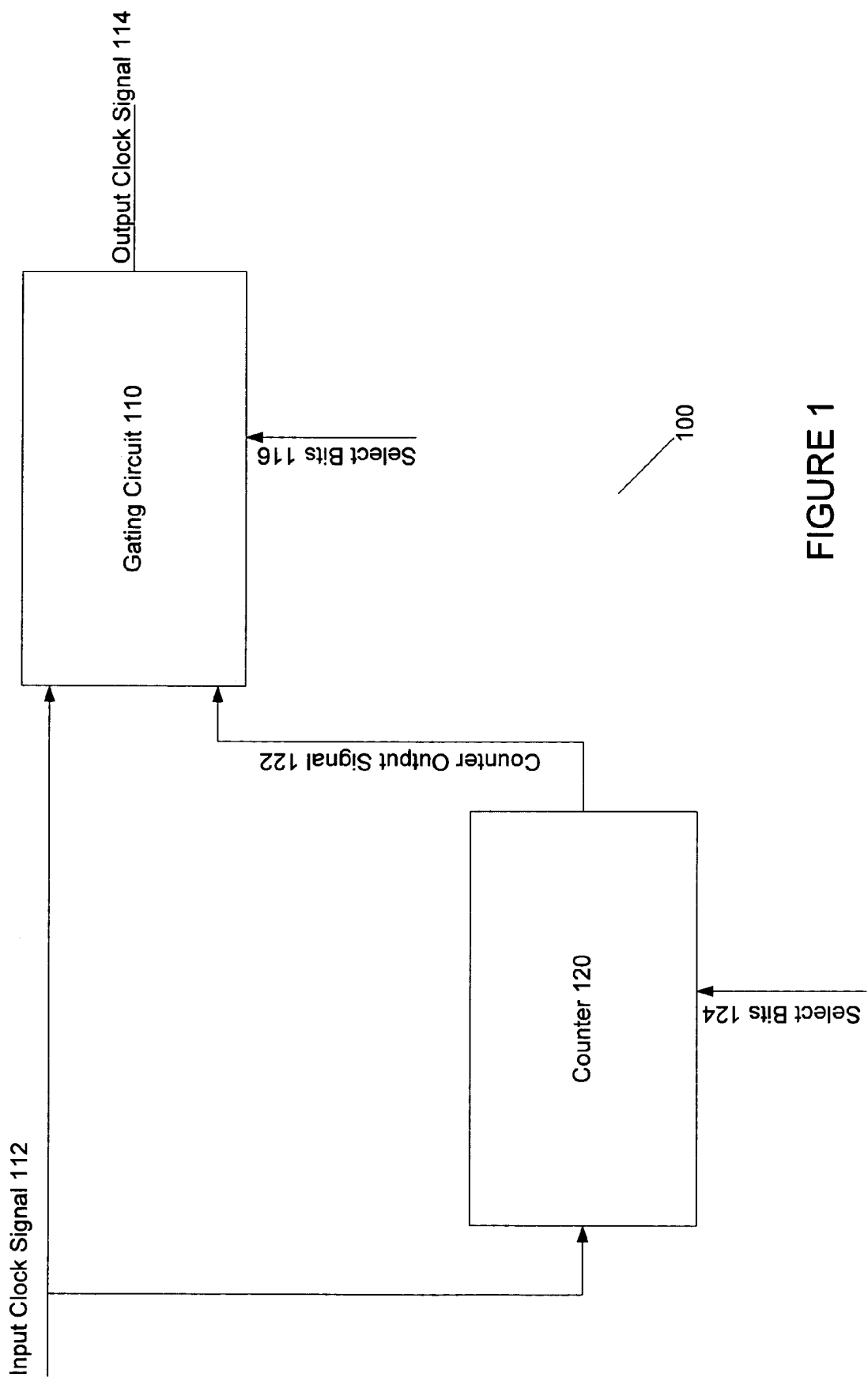
FIG. 1 depicts one embodiment of a circuit according to the systems and methods of the present invention.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Reference is now made in detail to the exemplary embodiments of the invention, examples of which are illustrated in the accompanying drawings. Wherever possible, the same reference numbers will be used throughout the drawings to refer to the same or like parts (elements).

Attention is now directed to systems and methods for circuits which can reduce the average frequency of a clock signal while keeping the maximum frequency of the clock signal. Embodiments of these systems and methods may allow for a circuit which receives a clock signal and can output a clock signal with a frequency which is on average some ratio of the frequency of the received clock signal, but still has a maximum frequency which is substantially equal to the frequency of the received clock signal. In one mode of operation, these circuits may output a clock signal substantially identical to a received clock signal, while in another mode of operation these circuits may output a clock signal substantially identical to a received clock substantially only during a time interval, thus reducing the average frequency of the output clock signal with respect to the received clock signal while maintaining the maximum frequency of the received clock signal.

These circuits may have a gating circuit which in the first mode of operation outputs a clock signal substantially identical to a received clock signal and in the second mode of operation outputs a clock signal substantially identical to the received clock signal during a time interval determined by a gating signal received from a counter circuit. The length of this time interval may be a ratio of the frequency of the received clock signal such that only a rising edge or a falling edge of the received clock signal is output by the gating circuit during the time interval.

Consequently, an embodiment of a circuit of the type provided by the systems and methods of the present invention may be implemented on a semiconductor in conjunction with a phase locked loop (PLL). During normal operation of the semiconductor this circuit may receive a clock signal from the PLL and provide a substantially identical clock signal to a clock distribution system on the semiconductor. When testing the semiconductor, however, this circuit may be used to test the semiconductor at a target clock frequency, while reducing the average frequency of the clock used to test the semiconductor.

A clock signal of the target frequency may be received by this circuit from the PLL. This circuit may then provide a clock signal with the target frequency to the clock distribution mechanism of the semiconductor only during certain time intervals. Thus, benefits of a continuous full speed ac test may be achieved by testing the gates of the semiconductor with a clock signal of the target frequency during the time intervals while reducing the average frequency of the clock used to test the semiconductor, and commensurately reducing the power consumption and temperature concerns usually associated with such a full speed ac test.

Turning to FIG. 1, one embodiment of a circuit according to the systems and methods of the present invention is depicted. Circuit 100 may be suitable for providing a clock signal substantially equal to a received clock signal during one mode of operation and, during a second mode of operation, for providing a clock signal with a frequency substantially equal to the received clock signal during timing intervals which occur at a frequency which is some ratio of the frequency of the received clock signal.

Circuit 100 comprises gating circuit 110 and counter 120. Gating circuit 110 receives input clock signal 112 and counter output signal 122 from counter 120. Counter 120 receives input clock signal 112 and produces counter output signal 122 based on select bits 124. Output clock signal 114 of gating circuit 110 is determined by the state of select bits 116, which in one embodiment may be the same as select bits 124.

In a first mode of operation, determined by select bits 116, output clock signal 114 of gating circuit 110 is substantially identical to input clock signal 112. In a second mode of operation, however, the output clock signal 114 of gating circuit 110 is based on counter output signal 122 of counter 120.

Counter 120 may produce a signal with timing intervals spaced at a frequency which is substantially a ratio of the frequency of input clock signal 112 on counter output signal 122. This ratio may be determined by select bits 124. In one embodiment, timing intervals on counter output signal 122 of counter 120 may occur at approximately a fourth the frequency of input clock signal 112, an eighth the frequency of input clock signal 112 or a sixteenth the frequency of input clock signal 112, depending on the state of select bits 124.

During the second mode of operation, which may be indicated by select bits 116, gating circuit 110 may be gated by the timing intervals present on counter output signal 122 of counter 120. During a timing interval on counter output signal 122, output signal 114 of gating circuit 110 is substantially equal to input clock signal 112. Between these timing intervals, however, output clock signal 114 may be held substantially constant.

Figure 2:
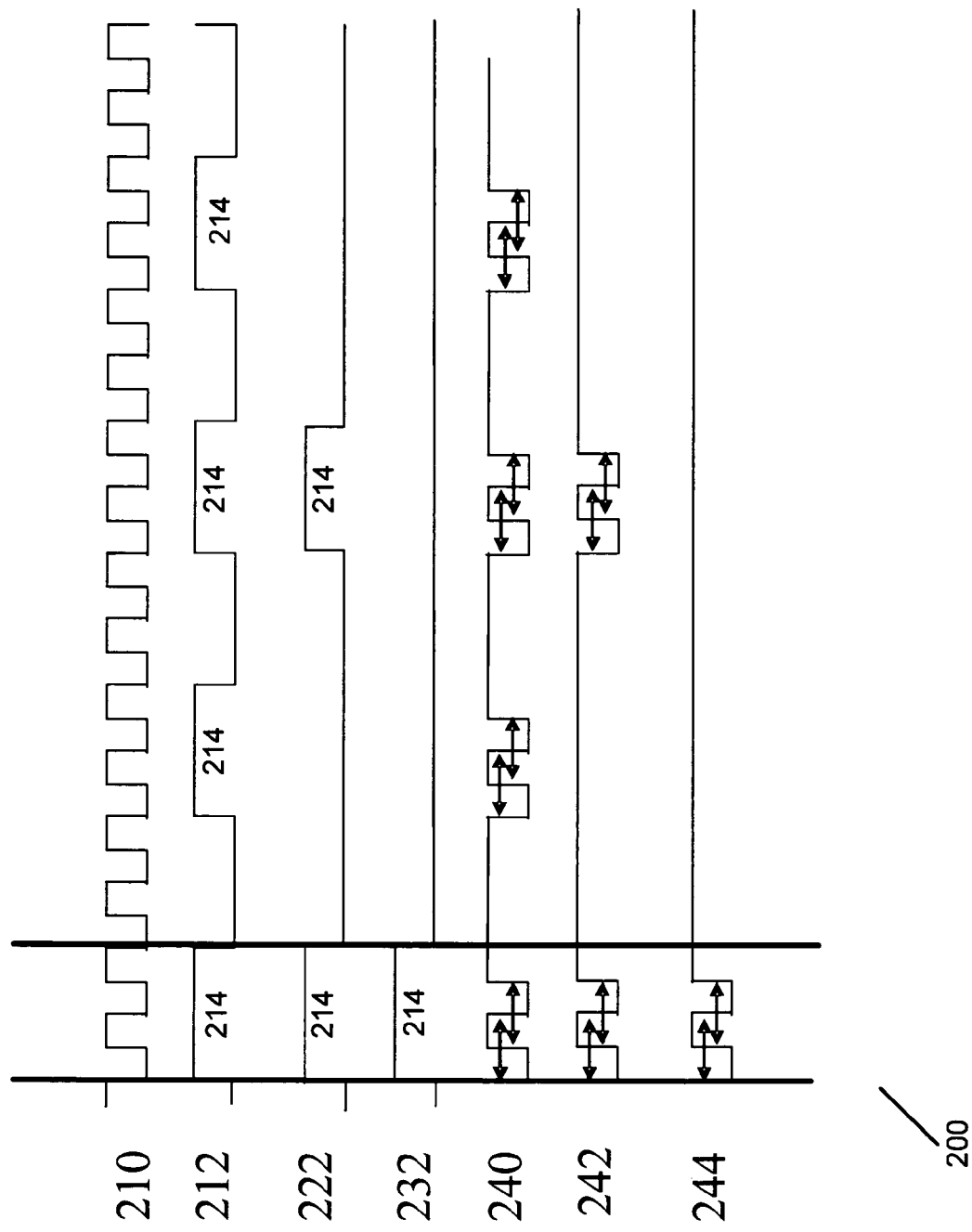
FIG. 2 depicts a timing diagram

This functionality may be explained more clearly with reference to the timing diagram presented in FIG. 2. Timing diagram 200 represents one embodiment of the operation of the circuit depicted in FIG. 1. Line 210 represents a signal on input clock signal 112. Line 212 represents a signal on counter output signal 122 of counter 120 where timing intervals 214 occur at approximately a fourth the frequency of clock cycles of clock signal 210 (meaning that a timing interval 214 begins approximately every fourth clock cycle of input clock signal 112); line 222 represents a signal on counter output signal 122 of counter 120 where timing intervals 214 occur at approximately an eighth the frequency of clock cycles of clock signal 210; and line 232 represents a signal on counter output signal 122 of counter 120 where timing intervals 214 occur at approximately a sixteenth the frequency of clock cycles of clock signal 210.

During one mode of operation, output signal 114 may be substantially identical to input clock signal 112 represented by line 210. Assume now, however, that select bits 116 are in a state such that gating circuit 110 is to be gated by counter output signal 122 of counter 120 and select bits 124 are in a state such that counter output signal 122 of counter is that of line 222, where timing intervals 214 occur at approximately an eighth the frequency of input clock signal 112 represented by line 210. In this case, during timing intervals 214, output signal 114 of gating circuit 110 represented by line 242 is a clock signal with substantially the same frequency as input clock signal 112 represented by line 210. Between time intervals 214, however, output signal 114 is substantially constant.

In one embodiment, timing intervals 214 may be substantially equal to two cycles of input clock signal 112 represented by line 210, such that during timing interval 214 two falling edges and two rising edges of input clock signal 112 are output on output line 114. Thus, in this case, as timing intervals 214 occur approximately every eight clock cycles of input clock signal 112 and the duration of each timing interval is approximately two clock cycles of input clock signal 112, the average clock frequency of output clock signal 114 is substantially an eighth or less that of input clock signal 112. The maximum frequency of output clock signal 114 is, however, still substantially identical to input clock signal 112.

Similarly, assume that select bits 116 are in a state such that gating circuit 110 is to be gated by counter output signal 122 of counter 120 and select bits 124 are in a state such that counter output signal 122 of counter 120 is that of line 232, where timing intervals 214 occur at approximately a sixteenth the frequency of input clock signal 112 represented by line 210. Therefore, during timing intervals 214, output signal 114 of gating circuit 110, represented by line 244, is a clock signal with substantially the same frequency as input clock signal 112 represented by line 210, however the average clock frequency of output clock signal 114 is substantially a sixteenth or less that of input clock signal 112.

Figure 3A:
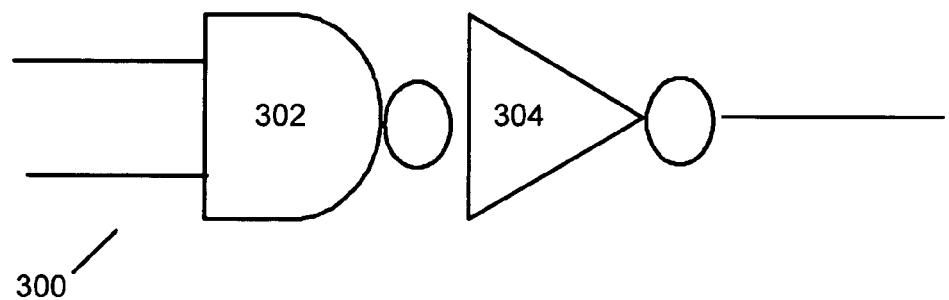
FIGS. 3A-3C depict embodiments of gating circuits suitable for use with embodiments of the present invention.
Figure 3B:
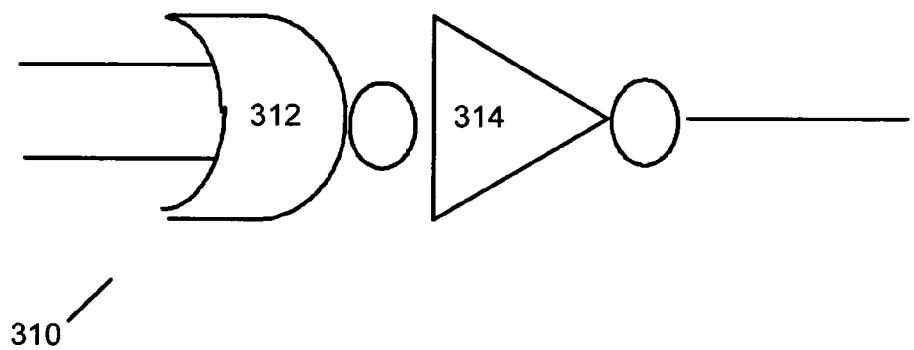
Figure 3C:
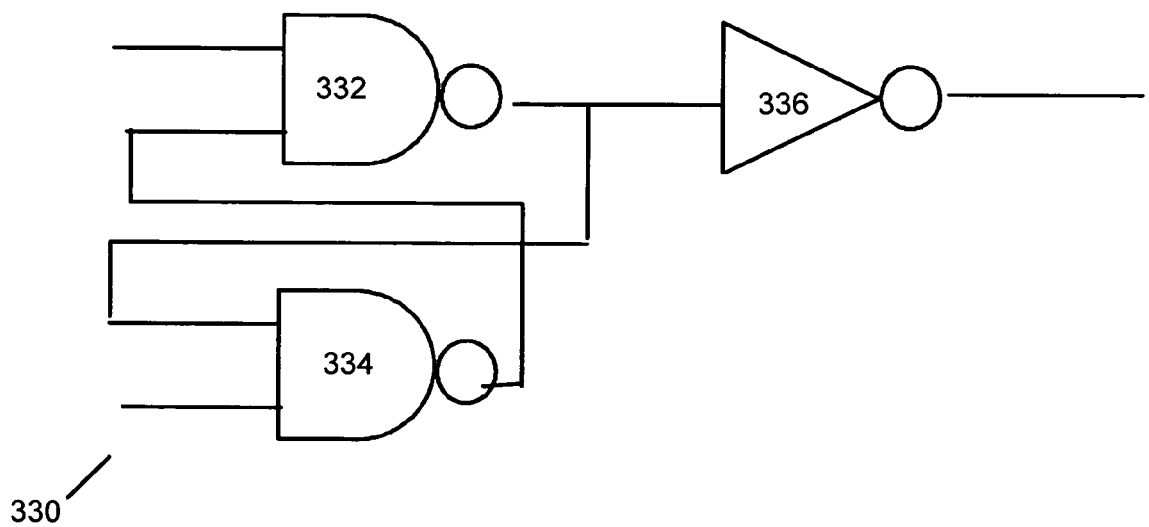

Turning to FIGS. 3A-3C embodiments of gating circuits which may be utilized in embodiments of the present invention are depicted. Gating circuit 110 may be selected based on the complexity of resulting circuit that is desired, which phase of the input clock signal it is desired to pass through, the frequency of the input clock signal, the desire to account for asymmetry between the input clock signal and the input from counter 120 etc.

FIG. 3A depicts and embodiment of and type gating circuit 300, comprising nand gate 302 coupled to inverter 304. FIG. 3B depicts or type gating circuit 310, comprising nor-gate 312 coupled to inverter 314. FIG. 3C depicts set-reset (SR) type gating circuit 330, comprising nand gates 332, 334 and inverter 336. In SR gating circuit 330 the output of nand gate 332 is coupled to the input of nand gate 334 and the output of nand gate 334 is coupled to the input of nand gate 332. The output of nand gate 332 is coupled to inverter 336, the output of which is the output of SR gating circuit 330.

Figure 4:
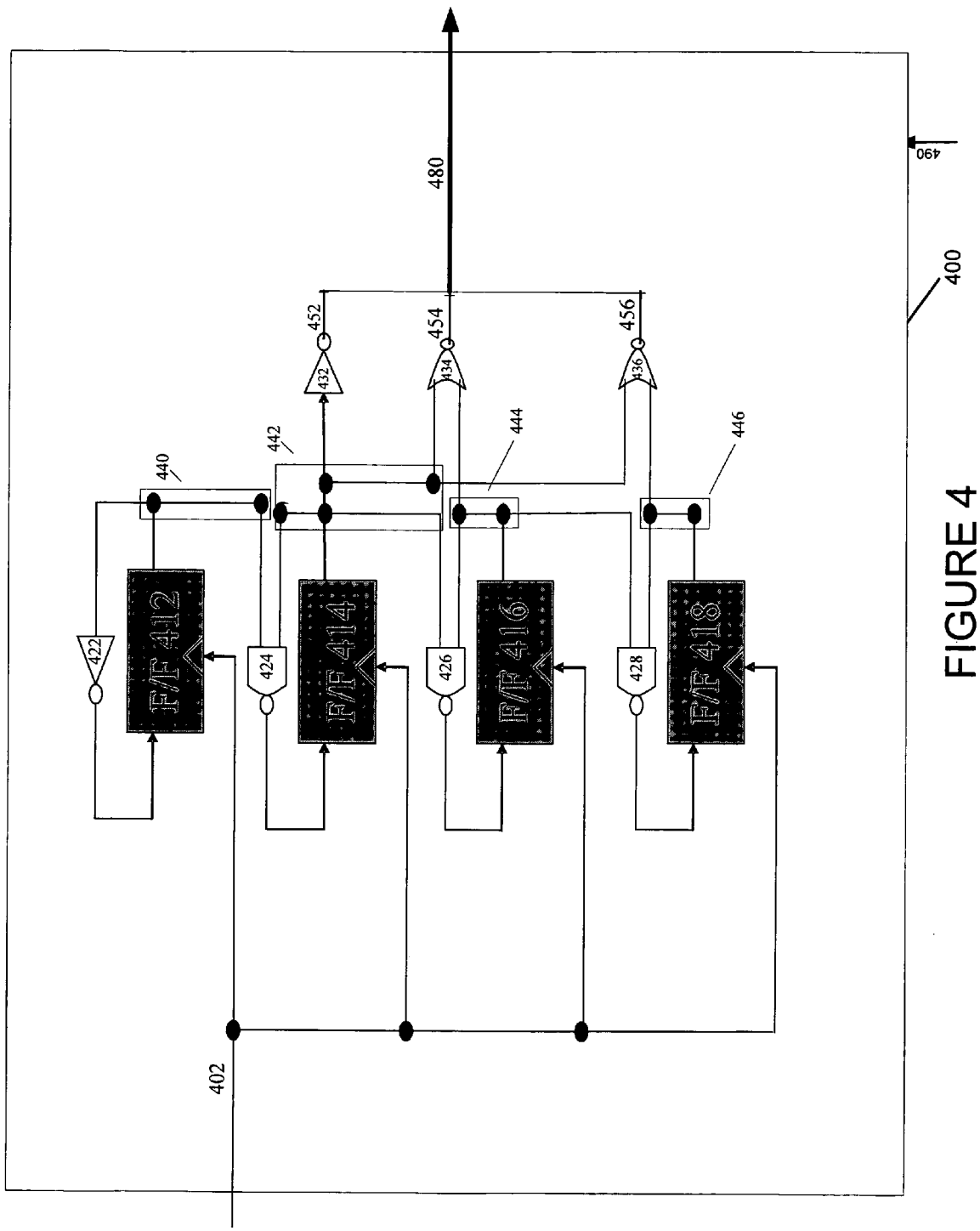
FIG. 4 depicts one embodiment of a counter circuit suitable for use with embodiments of the present invention.

Moving to FIG. 4, one embodiment of a counter circuit which may be utilized with embodiments of the present invention is depicted. Counter circuit 400 receives input clock signal 402 and may produce output signal 480 with timing intervals occurring at a fourth, an eighth or a sixteenth the frequency of input signal 402, where each timing interval is approximately equal to two clock cycles of input clock signal 402. Input clock signal 402 is coupled to flip-flops 412, 414, 416 and 418. The output of flip-flop 412 is coupled to inverter 422, the output of which is in turn coupled to the input of flip-flop 412.

The output of flip-flop 412 is also coupled to one input of nand gate 424 while the other input of nand gate 424 is coupled to node 442. The output of nand gate 424 is coupled to the input of flip-flop 414. The output of flip-flop 414 is, in turn, coupled to node 442. Inverter 432 receives input from node 442 and produces output signal 452.

Node 442 also provides one input to nand gate 426. The other input of nand gate 426 is coupled to node 444. The output of nand gate 426 is coupled to the input of flip-flop 416. The output of flip-flop 416 is coupled to node 444. Nor gate 434 receives input from nodes 442 and 444 and produces output signal 454.

Node 444 is also coupled to the input of nand gate 428. The other input of nand gate 428 is coupled to node 446. The output of nand gate 428 is coupled to the input of flip-flop 418. The output of flip-flop 418 is coupled to node 446. Nor gate 436 receives input from nodes 442 and 446 and produces output signal 456.

During operation, counter circuit 400 may produce timing intervals substantially equal in duration to two cycles of the clock received on input clock signal 402. On output signal 452 the timing intervals may be occur a fourth the frequency of the clock received at input 402, on output signal 454 the timing intervals may occur at approximately an eigth of the frequency of the clock signal received at input 402, while at output signal 456 the timing intervals may occur at approximately a sixteenth the frequency of the clock signal received at input 402. One of output signals 452, 454, or 456 may be selected as output signal 480 based on the state of select bits 490.

Figure 5:
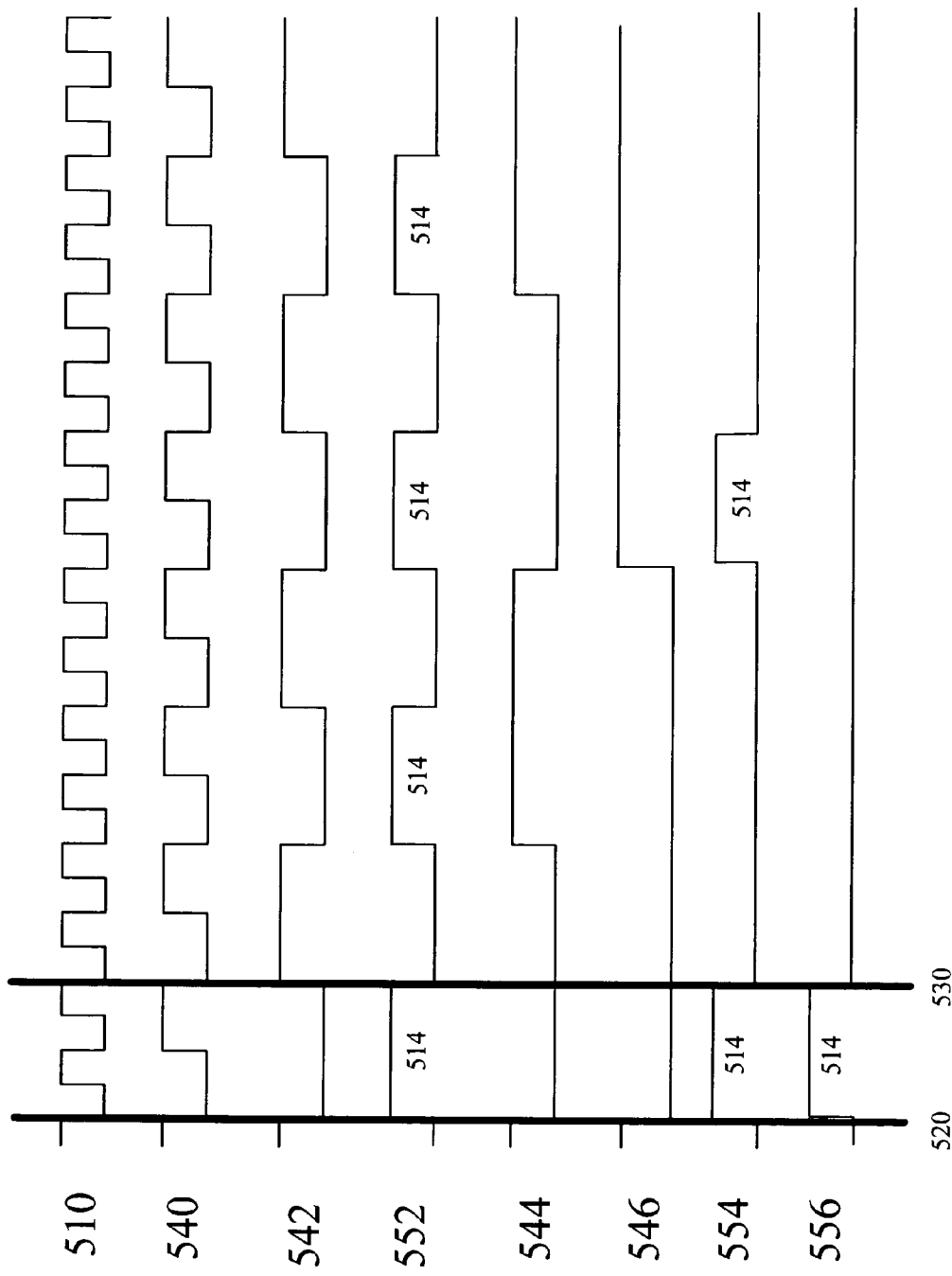
FIG. 5 depicts a timing diagram.

The functionality of circuit 400 may be explained more clearly with reference to the timing diagram presented in FIG. 5. Timing diagram 500 represents one embodiment of the operation of counter circuit 400 depicted in FIG. 4. Line 510 represents a signal on input clock signal 402; line 540 represents a signal at node 440; line 542 represents a signal at node 442; line 544 represents a signal at node 444; line 546 represents a signal at node 446; line 552 represents a signal on output signal 452; line 554 represents output signal 454 and line 556 represents output signal 456.

As can be seen, the signal at node 440 as represented by line 540 is half the frequency of input clock signal 402 represented by line 510. The signal at node 442, represented by line 542, is in turn based on the signal at node 440, such that the signal at node 442 is a fourth the frequency of input clock signal 402. Output 452, represented by line 552, is the output of inverter 432, which receives its inputs from node 442. Thus, output 452 is the inverse of the signal at node 442. For example, at time 520 the signal at node 442 goes low while output 452 goes high. Conversely, when the signal at node 442 again goes high at time 530, output 452 goes low. Notice that time interval 514 between time periods 520 and 530 is approximately equal to two clock cycle of input clock signal 402. Additionally, notice that because output 452 is dependent the signal at node 440, which is half the frequency of input clock signal 402, and node 442, which is a fourth the frequency of input clock signal 402, timing intervals 514 occur approximately every fourth clock cycle of input clock signal 402 on output 452.

Similarly, the signal at node 444, represented by line 544, is in turn based on node 442, such that the signal at node 444 is an eighth the frequency of input clock signal 402. Output 454, represented by line 554, is the output of nor gate 434, which receives its inputs from node 442 and node 444. Thus, when both the signal at node 440 and node 442 are low, output signal 454 becomes high and when either the signal at node 442 or node 444 again goes high, output signal 454 goes low. For example, at time 520 both the output at node 442 and node 444 go low while output 454 goes high. Conversely, when the signal at node 442 again goes high at time 530, output 454 goes low. Notice that time interval 514 between time periods 520 and 530 is approximately equal to two clock cycles of input clock signal 402. Additionally, notice that because output signal 454 is dependent on the signal at node 442, which is a quarter the frequency of input clock signal 402, and node 444, which is an eighth the frequency of input clock signal 402, timing intervals 514 occur approximately every eighth clock cycle of input clock signal 402 on output 454.

Referring still to FIG. 5, the signal at node 446, represented by line 546, is in turn based on node 444, such that the signal at node 446 is a sixteenth the frequency of input clock signal 402. Output 456, represented by line 556, is the output of nor gate 436, which receives its inputs from node 442 and node 446. Thus, when both the signal at node 442 and node 446 are low, output signal 456 becomes high and when either the signal at node 442 or node 446 again goes high, output signal 456 goes low. For example, at time 520 both the output at node 442 and node 446 go low while output 456 goes high. Conversely, when the signal at node 442 again goes high at time 530, output 456 goes low. Notice that time interval 514 between time periods 520 and 530 is approximately equal to two clock cycles of input clock signal 402. Additionally, notice that because output signal 456 is dependent on the signal at node 442, which is a quarter the frequency of input clock signal 402, and node 446, which is a sixteenth the frequency of input clock signal 402, timing intervals 514 occur approximately every sixteenth clock cycle of input clock signal 402 on output 456.

It will be apparent to those of skill in the art that the particular embodiment of the invention to utilize in a particular case will depend on the characteristics of the case, and may include such factors as the semiconductor with which the embodiment may be utilized, the frequency of the clock signal with which the embodiment may be utilized, the power consumption constraints which may be placed on the system with which the embodiment may be utilized etc. The particular embodiment of the invention to be utilized may be determined based on an empirical analysis or simulation involving one or more of these factors, as will be apparent to those of ordinary skill in the art.

It will also be apparent that any combination of gating circuits and counter circuits may be combined to make embodiments of the present invention, and that other gating circuits and counter circuits than those depicted above may be utilized to make embodiments of the present invention. Similarly, it will be apparent that embodiments of the present invention utilizing these gating and counter circuits may produce timing intervals of substantially any length at substantially any frequency relative to a clock signal.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A circuit, comprising:
    a counter circuit operable to provide a counter signal corresponding to a set of timing intervals based upon an input clock signal having a first frequency, wherein the timing intervals occur at a second frequency which is a first ratio of the input clock signal and a duration of each of the timing intervals is a second ratio of the input clock signal; and
    a gating circuit coupled to the counter signal and operable to produce an output clock signal in a first mode of operation or a second mode of operation, wherein a third frequency of the output clock signal is substantially identical to the first frequency of the input clock signal in the first mode of operation and in the second mode of operation the gating circuit produces the output clock during each of the set of timing intervals, the output clock is held substantially constant between each of the timing intervals and the third frequency of the output clock is substantially identical to the first frequency of the input clock signal during each of the set of timing intervals.

2. The circuit of claim 1, wherein the output clock signal is substantially constant between each of the timing intervals in the second mode of operation.

3. The circuit of claim 2, wherein the counter signal is based on the input clock signal.

4. The circuit of claim 3, wherein a duration of each timing interval is based on the input clock signal.

5. The circuit of claim 4, wherein the duration of each timing interval is substantially equal to two clock cycles of the input clock signal.

6. The circuit of claim 5, wherein a frequency of the timing intervals is based on the input clock signal.

7. The circuit of claim 6, wherein the timing intervals are at substantially a fourth, an eighth or a sixteenth of a frequency of the input clock signal.

8. The circuit of claim 7, wherein the counter circuit comprises:
    a first flip flop clocked by the input clock signal and having an input and an output;
    a second flip flop clocked by the input clock signal and having an input and an output;
    a third flip-flop clocked by the input clock signal and having an input and an output;
    a fourth flip-flop clocked by the input clock signal and having an input and an output;
    a first inverter with an input coupled to the output of the first flip flop and an output coupled to the input of the first flip flop;

a first nand gate with a first input coupled to the output of the first flip flop, a second input coupled to the output of the second flip flop and an output coupled to the input of the second flip flop;

a second nand gate with a first input coupled to the output of the second flip flop, a second input coupled to the output of the third flip flop and an output coupled to the input of the third flip flop;

a third nand gate with a first input coupled to the output of the third flip flop, a second input coupled to the output of the fourth flip flop and an output coupled to the input of the fourth flip flop;

a second inverter with an input coupled to the output of the second flip flop;

a first nor gate with a first input coupled to the output of the second flip flop and a second input coupled to the output of the third flip flop; and a second nor gate with a first input coupled to the output of the second flip flop and a second input coupled to the output of the fourth flip flop.

9. The circuit of claim 8, wherein the second inverter is operable to provide an output signal with timing intervals at substantially a fourth of the frequency of the input clock signal, the first nor gate is operable to provide an output signal with timing intervals at substantially an eighth of the frequency of the input clock signal and the second nor gate is operable to provide an output signal with timing intervals at substantially a sixteenth of the frequency of the input clock signal.

10. The circuit of claim 9, wherein the counter circuit is operable to select the output signal of the second inverter, the output signal of the first nor gate or the output signal of the second nor gate as the counter signal.

11. The circuit of claim 10, wherein the gating circuit comprises an and type gating circuit, an or type gating circuit or a set/reset (SR) type gating circuit.

12. A method for providing a clock signal, comprising:
producing an output clock signal substantially identical to an input clock signal having a first frequency in a first mode of operation; and
producing an output clock signal substantially identical to the input clock signal during substantially at least one of a set of timing intervals in a second mode of operation, wherein in the second mode of operation the output clock sign is produced according to a set of timing intervals determined based upon the input clock signal, wherein the timing intervals occur at a second frequency which is a first ratio of the input clock signal and a duration of each of the timing intervals is a second ratio of the input clock signal and wherein a third frequency of the output clock signal is substantially identical to the first frequency of the input clock signal in the first mode of operation and in the second mode of operation the output clock is held substantially constant between each of the timing intervals and the third frequency of the output clock is substantially identical to the first frequency of the input clock signal during each of the set of timing intervals.

13. The method of claim 12, further comprising maintaining the output clock signal substantially constant between each of the timing intervals in the second mode of operation.

14. The method of claim 13, determining the set of timing intervals based on the input clock signal.

15. The method of claim 14, determining a duration of each timing interval based on the input clock signal.

16. The method of claim 15, wherein the duration of each timing interval is substantially equal to two clock cycles of the input clock signal.

17. The method of claim 16, further comprising determining a frequency of the timing intervals based on the input clock signal.

18. The method of claim 17, further comprising selecting the frequency of the timing intervals.

19. The method of claim 18, wherein the timing intervals are at substantially a fourth, an eighth or a sixteenth of a frequency of the input clock signal.

20. The method of claim 19, further comprising selecting the first mode of operation or the second mode of operation.

21. A circuit, comprising:
a counter circuit operable to provide a counter signal with a set of timing intervals wherein the counter circuit comprises
a first flip flop clocked by the input clock signal and having an input and an output,
a second flip flop clocked by the input clock signal and having an input and an output,
a third flip-flop clocked by the input clock signal and having an input and an output,
a fourth flip-flop clocked by the input clock signal and having an input and an output,
a first inverter with an input coupled to the output of the first flip flop and an output coupled to the input of the first flip flop,
a first nand gate with a first input coupled to the output of the first flip flop, a second input coupled to the output of the second flip flop and an output coupled to the input of the second flip flop,
a second nand gate with a first input coupled to the output of the second flip flop, a second input coupled to the output of the third flip flop and an output coupled to the input of the third flip flop,
a third nand gate with a first input coupled to the output of the third flip flop, a second input coupled to the output of the fourth flip flop and an output coupled to the input of the fourth flip flop,
a second inverter with an input coupled to the output of the second flip flop,
a first nor gate with a first input coupled to the output of the second flip flop and a second input coupled to the output of the third flip flop, and
a second nor gate with a first input coupled to the output of the second flip flop and a second input coupled to the output of the fourth flip flop; and
a gating circuit operable to produce an output clock signal, wherein the output clock signal is substantially identical to an input clock signal in a first mode of operation and substantially identical to the input clock signal during substantially at least one of the set of timing intervals in a second mode of operation.

22. The circuit of claim 21, wherein the output clock signal is substantially constant between each of the timing intervals in the second mode of operation.

23. The circuit of claim 22, wherein the counter signal is based on the input clock signal.

24. The circuit of claim 23, wherein a duration of each timing interval is based on the input clock signal.

25. The circuit of claim 24, wherein the duration of each timing interval is substantially equal to two clock cycles of the input clock signal.

26. The circuit of claim 25, wherein a frequency of the timing intervals is based on the input clock signal.

27. The circuit of claim 26, wherein the timing intervals are at substantially a fourth, an eighth or a sixteenth of a frequency of the input clock signal.

28. The circuit of claim 27, wherein the second inverter is operable to provide an output signal with timing intervals at substantially a fourth of the frequency of the input clock signal, the first nor gate is operable to provide an output signal with timing intervals at substantially an eighth of the frequency of the input clock signal and the second nor gate is operable to provide an output signal with timing intervals at substantially a sixteenth of the frequency of the input clock signal.

29. The circuit of claim 28, wherein the counter circuit is operable to select the output signal of the second inverter, the output signal of the first nor gate or the output signal of the second nor gate as the counter signal.

30. The circuit of claim 29, wherein the gating circuit comprises an and type gating circuit, an or type gating circuit or a set/reset (SR) type gating circuit.

31. A method for providing a clock signal, comprising:
producing an output clock signal substantially identical to an input clock signal in a first mode of operation; and
producing an output clock signal substantially identical to the input clock signal during substantially at least one of a set of timing intervals in a second mode of operation wherein the timing intervals are produced by a counter circuit comprising
a first flip flop clocked by the input clock signal and having an input and an output,
a second flip flop clocked by the input clock signal and having an input and an output,
a third flip-flop clocked by the input clock signal and having an input and an output,
a fourth flip-flop clocked by the input clock signal and having an input and an output,
a first inverter with an input coupled to the output of the first flip flop and an output coupled to the input of the first flip flop,
a first nand gate with a first input coupled to the output of the first flip flop, a second input coupled to the output of the second flip flop and an output coupled to the input of the second flip flop,
a second nand gate with a first input coupled to the output of the second flip flop, a second input coupled to the output of the third flip flop and an output coupled to the input of the third flip flop,
a third nand gate with a first input coupled to the output of the third flip flop, a second input coupled to the output of the fourth flip flop and an output coupled to the input of the fourth flip flop,
a second inverter with an input coupled to the output of the second flip flop,
a first nor gate with a first input coupled to the output of the second flip flop and a second input coupled to the output of the third flip flop, and
a second nor gate with a first input coupled to the output of the second flip flop and a second input coupled to the output of the fourth flip flop.

32. The method of claim 31, further comprising maintaining the output clock signal substantially constant between each of the timing intervals in the second mode of operation.

33. The method of claim 32, determining the set of timing intervals based on the input clock signal.

34. The method of claim 33, determining a duration of each timing interval based on the input clock signal.

35. The method of claim 34, wherein the duration of each timing interval is substantially equal to two clock cycles of the input clock signal.

36. The method of claim 35, further comprising determining a frequency of the timing intervals based on the input clock signal.

37. The method of claim 36, further comprising selecting the frequency of the timing intervals.

38. The method of claim 37, wherein the timing intervals are at substantially a fourth, an eighth or a sixteenth of a frequency of the input clock signal.

39. The method of claim 38, further comprising selecting the first mode of operation or the second mode of operation.

* * * * *